(12) United States Patent
Ramani et al.

(10) Patent No.: US 8,828,836 B2
(45) Date of Patent: *Sep. 9, 2014

(54) METHOD FOR FABRICATING A DRAM CAPACITOR

(75) Inventors: Karthik Ramani, Santa Clara, CA (US); Hiroyuki Ode, Hiroshima (JP); Sandra Malhotra, San Jose, CA (US)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/153,626

(22) Filed: Jun. 6, 2011

(65) Prior Publication Data
US 2012/0309160 A1 Dec. 6, 2012

(51) Int. Cl.
*H01L 21/20* (2006.01)
*H01L 49/02* (2006.01)
*H01L 29/92* (2006.01)

(52) U.S. Cl.
CPC .............. *H01L 28/40* (2013.01); *H01L 29/92* (2013.01); *H01L 28/65* (2013.01); *H01L 28/60* (2013.01)
USPC .................... 438/381; 438/487; 257/E21.008

(58) Field of Classification Search
USPC .................................. 438/381, 387, 487, 648
See application file for complete search history.

(56) References Cited

U.S. PATENT DOCUMENTS

| | | | | |
|---|---|---|---|---|
| 6,156,606 | A * | 12/2000 | Michaelis | 438/243 |
| 6,265,295 | B1 | 7/2001 | Lin et al. | |
| 6,479,849 | B1 | 11/2002 | Katori | |
| 8,318,572 | B1 * | 11/2012 | Shanker et al. | 438/381 |
| 2002/0036313 | A1 * | 3/2002 | Yang et al. | 257/306 |
| 2006/0270166 | A1 * | 11/2006 | Yao et al. | 438/287 |
| 2007/0212829 | A1 * | 9/2007 | Takahashi et al. | 438/216 |
| 2011/0027960 | A1 * | 2/2011 | Matz et al. | 438/381 |
| 2012/0113561 | A1 * | 5/2012 | Chin | 361/311 |

OTHER PUBLICATIONS

Gebel, T.; Rebohle, L.; Fendler, R.; Hentsch, W.; Skorupa, W.; Voelskow, M.; Anwand, W.; Yankov, R.A.; , "Millisecond Annealing with Flashlamps: Tool and Process Challenges," Advanced Thermal Processing of Semiconductors, 2006. RTP '06. 14th IEEE International Conference on , vol., no., pp. 47-55, Oct. 10-13, 2006.*

Chowdhury, M. H., M. A. Mannan and S. A. Mahmood; "High-k Dielectrics for Submicron MOSFET", IJETSE International Journal of Emerging Technologies in Sciences and Engineering, vol. 2, No. 2, Jul. 2010.*

Jeremiah T. Abiade (2006). Xenon Flash Lamp Annealing Shown to be Effective for Processing Ultrathin HfO2 Films for Advanced CMOS Gate Dielectrics. MRS Bulletin, 31, pp. 83-84.*

Berthelot, A., et al.; Highly Reliable TiN/ZrO2/TiN 3D Stacked Capacitors for 45 nm Embedded DRAM Technologies; 2006; Freescale Semiconductor, Inc., 4 pages.

* cited by examiner

*Primary Examiner* — Thao X Le
*Assistant Examiner* — Laura Dykes (57) ABSTRACT

A method for fabricating a dynamic random access memory (DRAM) capacitor stack is disclosed wherein the stack includes a first electrode, a dielectric layer, and a second electrode. The first electrode is formed from a conductive binary metal. A dielectric layer is formed over the first electrode. The dielectric layer is subjected to a milliseconds anneal process that serves to crystallize the dielectric material and decrease the concentration of oxygen vacancies.

8 Claims, 8 Drawing Sheets

METHOD FOR FABRICATING A DRAM CAPACITOR

This document relates to the subject matter of a joint research agreement between Intermolecular, Inc. and Elpida Memory, Inc.

FIELD OF THE INVENTION

The present invention generally relates to the field of dynamic random access memory (DRAM), and more particularly to electrode processing for improved DRAM performance.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa\varepsilon_0 \frac{A}{d} \qquad \text{(Eqn. 1)}$$

where $\varepsilon_o$ represents the vacuum permittivity.

The dielectric constant is a measure of a material's polarizability. Therefore, the higher the dielectric constant of a material, the more charge the capacitor can hold. Therefore, if the k-value of the dielectric is increased, the area of the capacitor can be decreased and maintain the desired cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally <$10^{-7}$ A cm$^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, $SiO_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the $SiO_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of $SiO_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to $SiO_2$ known as the Equivalent Oxide Thickness (EOT). A high-k material's EOT is calculated using a normalized measure of silicon dioxide ($SiO_2$ k=3.9) as a reference, given by:

$$EOT = \frac{3.9}{\kappa} \cdot d \qquad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

One class of high-k dielectric materials possessing the characteristics required for implementation in advanced DRAM capacitors are high-k metal oxide materials. Titanium dioxide ($TiO_2$) is one metal oxide dielectric material which displays significant promise in terms of serving as a high-k dielectric material for implementation in DRAM capacitors.

The dielectric constant of a dielectric material may be dependent upon the crystalline phase(s) of the material. For example, in the case of $TiO_2$, the anatase crystalline phase of $TiO_2$ has a dielectric constant of approximately 40, while the rutile crystalline phase of $TiO_2$ can have a dielectric constant of approximately >80. Due to the higher-k value of the rutile-phase, it is desirable to produce $TiO_2$ based DRAM capacitors with the $TiO_2$ in the rutile-phase. The relative amounts of the anatase phase and the rutile phase can be determined from x-ray diffraction (XRD). From Eqn. 1 above, a $TiO_2$ layer in the rutile-phase could be physically thicker and maintain the same desired capacitance as a $TiO_2$ layer in the anatase-phase. The increased physical thickness is important for lowering the leakage current of the capacitor. The anatase phase will transition to the rutile phase at high temperatures (>800 C). However, high temperature processes are undesirable in the manufacture of DRAM devices. Traditional annealing processes may degrade the underlying electrode due to oxidation or promote interaction between the $TiO_2$ and the electrode material. The degradation may lead to an increase in the EOT and/or increased device leakage.

The crystal phase of an underlying layer can be used to influence the growth of a specific crystal phase of a subsequent material if their crystal structures are similar and their lattice constants are similar. This technique is well known in technologies such as epitaxial growth. The same concepts have been extended to the growth of thin films where the underlying layer can be used as a "template" to encourage the growth of a desired phase over other competing crystal phases.

Generally, as the dielectric constant of a material increases, the band gap of the material decreases. For example. The rutile phase of $TiO_2$ has a k-value of about 80 and a band gap of about 3.1 eV while $ZrO_2$ in the tetragonal phase has a k-value of about 45 and a band gap of about 5.5 eV. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Conductive metal oxides, conductive metal silicides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ is conductive and has shown great promise as an electrode material in DRAM capacitors. $MoO_2$ has a distorted rutile crystal structure and can serve as an acceptable template to promote the deposition of the rutile-phase of $TiO_2$ as discussed above. $MoO_2$ also has a high work function (can be >5.0 eV depending on process history) which helps to minimize the leakage current of the DRAM device. However, oxygen-rich phases ($MoO_{2+x}$) of $MoO_2$ degrade the performance of the $MoO_2$ electrode because they act more like insulators and have crystal structures that do not promote the deposition of the rutile-phase of $TiO_2$. For example, $MoO_3$ (the most oxygen-rich phase) is a dielectric material and has an orthorhombic crystal structure.

In a second example, TiN may be used as an electrode. TiN has a crystal structure of NaCl-type which is cubic. As such, TiN can serve as an acceptable template to promote the deposition of the tetragonal or cubic phases of $ZrO_2$. TiN has a high work function (can be ≥4.8 eV depending on process history) which is compatible with the higher band gap of $ZrO_2$. $ZrO_2$ is a dielectric material that can exhibit a k-value as high as ~45 depending on the processing conditions.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_{2+x}$ phases. The $MoO_{2+x}$ phases may form during the deposition of the electrode and may not be evenly distributed throughout the layer thickness. The $MoO_2$ electrode material may be deposited using any common deposition technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Typically, the $MoO_2$ electrode material must be annealed after deposition to fully crystallize the film. Even if the anneal is performed under an inert gas such as nitrogen, the presence of $MoO_{2+x}$ phases are observed and the effective k-value of the $TiO_2$ dielectric subsequently deposited on such an electrode is lower than desired.

Therefore, there is a need to develop an electrode system and processing steps that maximize the presence of crystalline $MoO_2$ and promotes the growth of the rutile-phase in a subsequently deposited $TiO_2$ dielectric layer, while simultaneously providing the high work function and manufacturability characteristics required for next generation DRAM capacitors. Alternatively, if the bottom electrode does not have to serve as a rutile-phase templating layer, then other non-noble high work function materials other than $MoO_2$ may be used. A work function of >5 eV would be required if the dielectric layer is $TiO_2$, and could be obtained with materials such as Ni, NiO, TiN, TiAlN or others.

There is also a need to develop an electrode system and processing steps that form $ZrO_2$ in the high-k tetragonal crystallographic phase, while simultaneously providing the high work function and manufacturability characteristics required for next generation DRAM capacitors. A work function of ≥4.8 eV would be required if the dielectric layer is $ZrO_2$, and could be obtained with materials such as Ni, NiO, TiN, TiAlN or others.

Furthermore, there is a need for post dielectric anneal process steps that increase the k-value of the dielectric, decrease the leakage current through the dielectric, and maintain the chemical, physical, structural, and electrical properties of the underlying electrode.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION OF THE INVENTION

It is to be understood that both the foregoing general description and the following detailed description are exemplary and explanatory only and are not restrictive of the invention as claimed. The accompanying drawings, which are incorporated in and constitute a part of the specification, illustrate embodiments of the invention and together with the general description, serve to illustrate the principles of the invention. Reference will now be made in detail to the subject matter disclosed, which is illustrated in the accompanying drawings.

Figure 1:
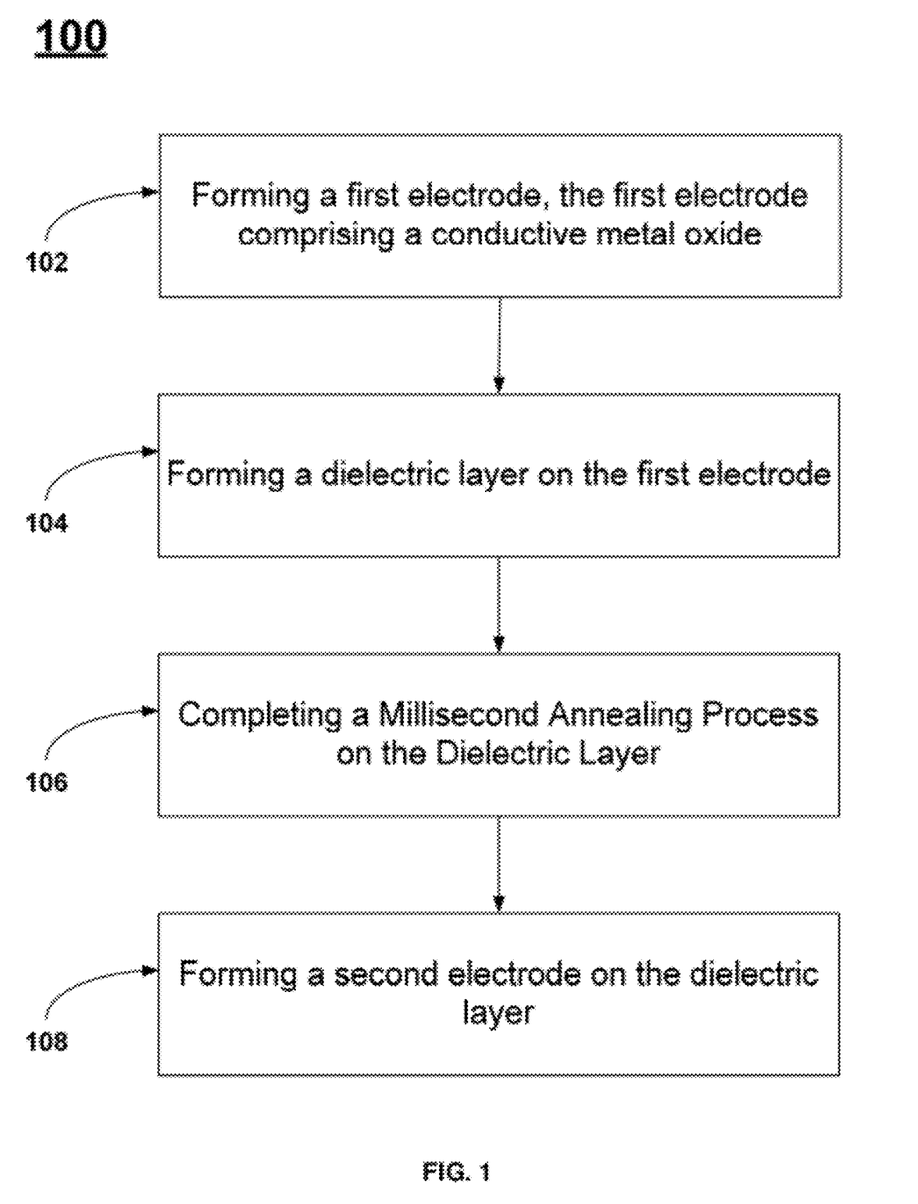
FIG. 1 illustrates a flow chart illustrating a method for fabricating a DRAM capacitor stack, in accordance with some embodiments of the present invention.

FIG. 1 describes a method, 100, for fabricating a DRAM capacitor stack. The initial step, 102, comprises forming a first electrode layer. Examples of suitable electrode materials comprise conductive metal oxides, conductive metal silicides, conductive metal nitrides, or combinations thereof. Two particularly interesting classes of materials are the conductive metal oxides and conductive metal nitrides. The next step, 104, comprises forming a dielectric material on the first electrode layer. The next step, 106, comprises performing a milliseconds anneal (MA) of the dielectric layer. The next step, 108, comprises forming a second electrode layer on the dielectric layer.

Those skilled in the art will appreciate that each of the first electrode layer, the dielectric layer, and the second electrode layer may be formed using well known techniques such as ALD, PE-ALD, AVD, UV-ALD, CVD, PECVD, or PVD. Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

In FIGS. 2-6 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

Figure 2:
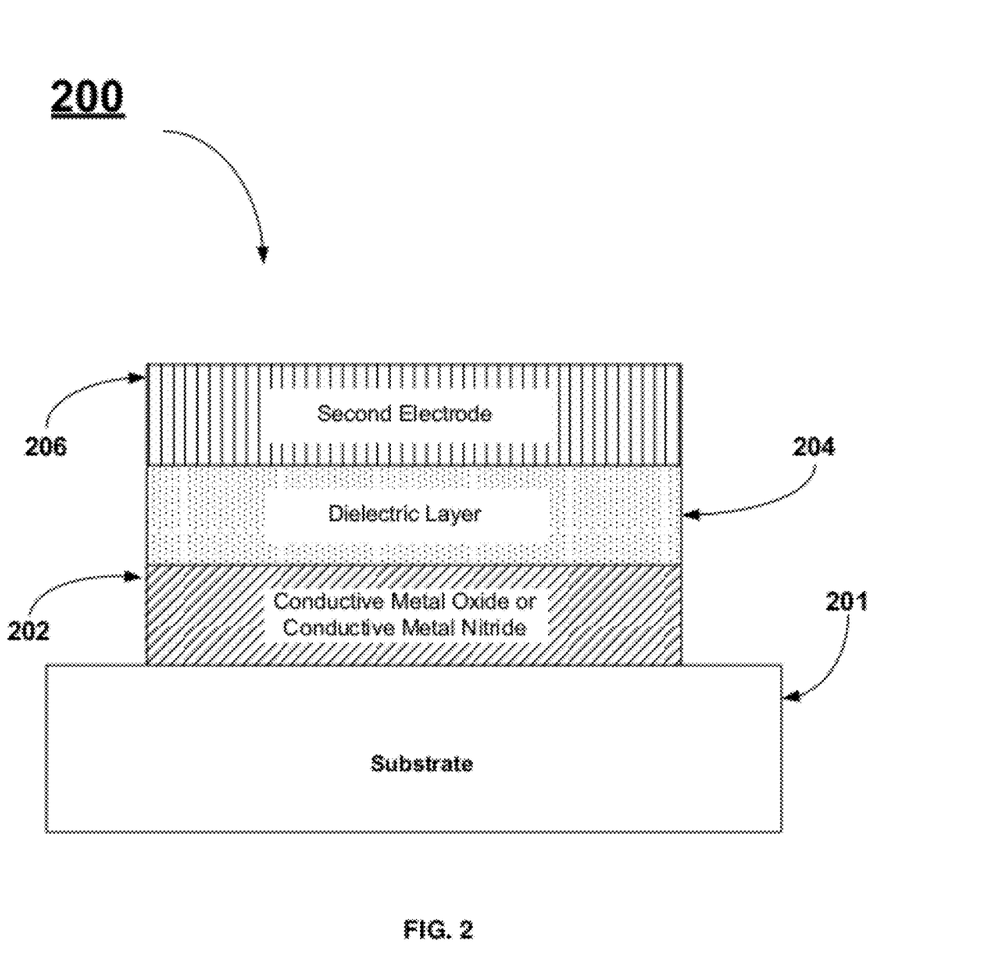
FIG. 2 illustrates a simplified cross-sectional view of a DRAM capacitor stack fabricated in accordance with some embodiments of the present invention.

FIG. 2 illustrates a simple capacitor stack, 200, consistent with some embodiments of the present invention. Generally, the substrate has already received several processing steps in the manufacture of a full DRAM device. Using the method as outlined in FIG. 1 and described above, first electrode layer, 202, is formed on substrate, 201. Examples of suitable electrode materials comprise conductive metal oxides, conductive metal silicides, conductive metal nitrides, and combinations thereof. Advantageously, first electrode layer, 202, may comprise a conductive metal oxide material. Examples of the conductive metal oxides include the conductive compounds of molybdenum oxide, tungsten oxide, ruthenium oxide, rhenium oxide, chromium oxide, rhodium oxide, iridium oxide, manganese oxide, tin oxide, cobalt oxide, or nickel oxide. Alternatively, first electrode, 202, may comprise a conductive metal nitride material. Examples of the conductive metal nitrides include the conductive compounds of titanium nitride, tantalum nitride, tungsten nitride, nickel nitride, or others. The choice of electrode material will depend on the choice of the dielectric layer to be formed in subsequent steps.

Optionally, the substrate with first electrode layer, 202, may be annealed. The annealing process crystallizes the electrode layer. Optionally, the first electrode may be annealed in a reducing atmosphere. This is especially advantageous if the first electrode is a conductive metal oxide. One example of such an annealing process is further described in U.S. application Ser. No. 13/084,666 filed on Apr. 12, 2011, entitled "METHOD FOR FABRICATING A DRAM CAPACITOR" and is incorporated herein by reference. Alternatively, the first electrode layer may be annealed using a Rapid Thermal Anneal (RTA) technique wherein the temperature is quickly raised in the presence of a nitrogen containing gas such as $N_2$, forming gas, $NH_3$, etc. Examples of such electrode treatment steps are further described in U.S. application Ser. No. 13/051,531 filed on Mar. 18, 2011, which is incorporated herein by reference.

In the next step, dielectric layer, 204, would then be formed on the first electrode layer, 202. A wide variety of dielectric materials have been targeted for use in DRAM capacitors. Examples of suitable dielectric materials comprise $SiO_2$, bilayer of $SiO_2$ and $Si_xN_y$, $SiON$, $Al_2O_3$, $HfO_2$, $HfSiO_x$, $ZrO_2$, $Ta_2O_5$, $TiO_2$, $SrTiO_3$ (STO), $SrBaTiO_x$ (SBT), $PbZrTiO_x$ (PZT) or doped versions of the same such as $Al:TiO_2$. These dielectric materials may be formed as a single layer or may be formed as a hybrid or nanolaminate structure. Specific dielectric materials of interest are the rutile-phase of $TiO_2$ and the tetragonal or cubic phases of $ZrO_2$.

The dielectric layer, 204, is then subjected to a millisecond anneal (MA) process. As used herein, a MA process will be understood to be an anneal process wherein the temperature of the substrate is raised to the final temperature in less than one second. This will distinguish the MA process from rapid thermal anneal (RTA) processes that can take place in timeframes as short as several seconds. The MA process may also be called a "spike anneal" process. In this process, the temperature of the surface substrate is raised from about room temperature to a process temperature between about 600 C and about 1200 C and advantageously to a temperature between about 600 C and about 900 C in less than one second and advantageously in less than about 10 milliseconds. The MA process may act to crystallize or further crystallize the dielectric layer. The MA process may be performed in an inert gas atmosphere. Additionally, if the MA process is performed using an oxidizing atmosphere, the concentration of oxygen vacancies ($V_{ox}$) may be reduced. By limiting the time of the MA process to times below one second, oxidation of the underlying electrode can be minimized.

The MA process can be accomplished in system wherein flash lamps are used to quickly heat the surface of the substrate without significantly raising the temperature of the bulk. An example of a suitable system is the LA-3000F system offered commercially by Dainippon Screen Manufacturing Company Limited with headquarters in Kyoto, Japan. This system utilizes xenon flash lamps to increase the substrate surface temperature.

In the next step, the second electrode layer, 206, is formed on dielectric layer, 204. The second electrode layer may be a conductive binary metal compound material as described above, a metal, or a combination thereof. The remaining full DRAM device (not shown) would then be manufactured using well known techniques. Optionally, the DRAM capacitor stack may undergo a post metallization anneal (PMA) treatment. Examples of the PMA treatment are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference.

Figure 3:
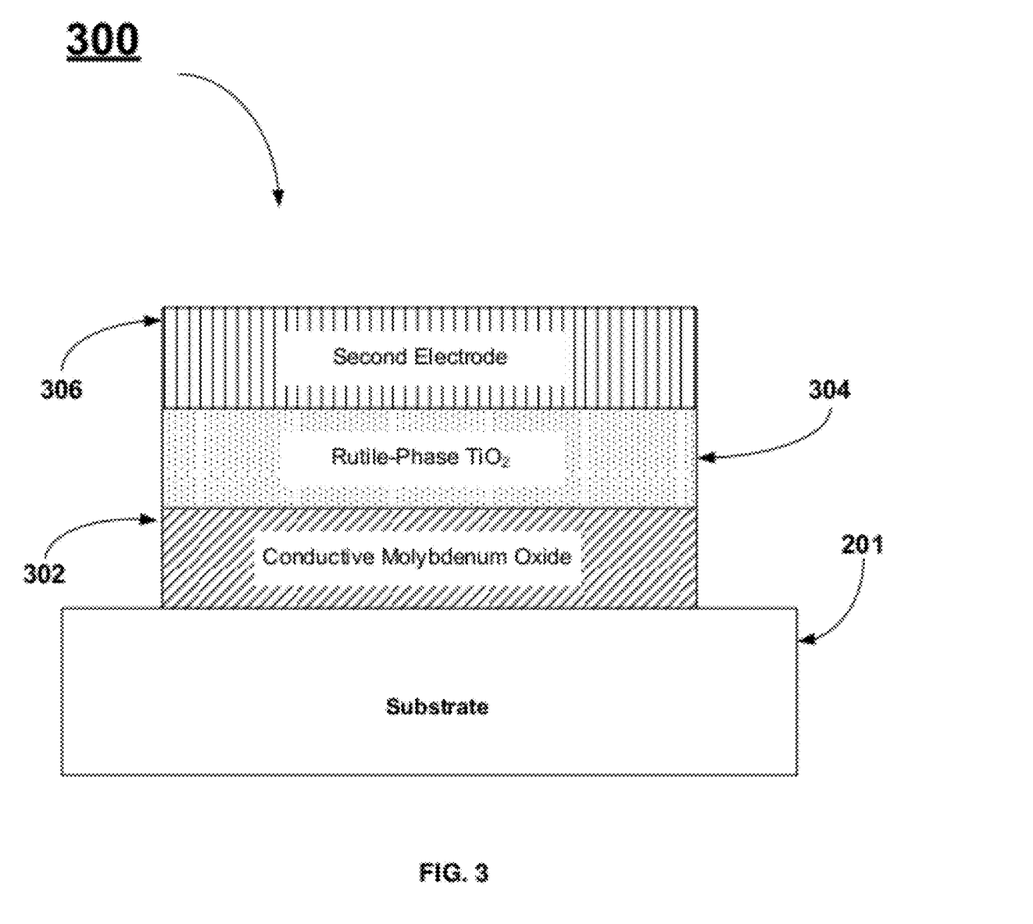
FIG. 3 illustrates a simplified cross-sectional view of a DRAM capacitor stack fabricated in accordance with some embodiments of the present invention.

FIG. 3 illustrates a specific example of a simple capacitor stack, 300, consistent with some embodiments of the present invention. Using the method as outlined in FIG. 1 and described above, first electrode layer, 302, is formed on substrate, 201. Generally, the substrate has already received several processing steps in the manufacture of a full DRAM device. First electrode layer, 302, comprises a $MoO_2$ material that may also contain oxygen-rich components ($MoO_{2+x}$). The goal is to maximize the amount of crystalline $MoO_2$ present in first electrode layer, 302, because it has a distorted rutile crystal structure and would serve as a good template to promote the growth of rutile-phase of a $TiO_2$ dielectric material in a later deposition step. Alternatively, if the bottom electrode does not have to serve as a rutile-phase templating layer, then other non-noble high work function materials other than $MoO_2$ may be used. A work function of >5 eV would be required if the dielectric layer is $TiO_2$, and could be obtained with materials such as Ni, NiO, TiN, TiAlN or others.

Optionally, the substrate with first electrode layer, 302, comprising $MoO_2$ mixed with $MoO_{2+x}$ would then be annealed in a reducing atmosphere to reduce the concentration of the oxygen-rich components and increase the relative amount of crystalline $MoO_2$ phases. The reducing atmosphere will crystallize the first electrode layer if there is an amorphous component and reduce the $MoO_{2+x}$ species to $MoO_2$. It is desirable that the crystalline $MoO_2$ phase account for ≥40% of the first electrode.

Dielectric layer, 304, would then be formed on the first electrode layer, 302. In this example, a layer of $TiO_2$ that exists predominantly (>30%) in the rutile-phase is formed as the dielectric layer, 304. The rutile-phase of $TiO_2$ grows preferentially over the anatase-phase due to the distorted rutile-phase crystal structure of the underlying predominantly $MoO_2$ electrode material. The $TiO_2$ layer generally has a physical layer thickness between 5 nm and 20 nm and exhibits a k value of >40. Alternatively, the $TiO_2$ layer would be formed in an amorphous or anatase phase if the underlying electrode does not act as a template for the rutile phase. In this case, the $TiO_2$ layer could be spike annealed using the MA step and portions of the layer would be converted into the rutile phase.

The dielectric layer, 304, is then subjected to an MA process. In this process, the temperature of the substrate is raised from about room temperature to about 900 C in less than 10 milliseconds. The MA process may act to crystallize or further crystallize the dielectric layer. Additionally, if the MA process is performed in an oxidizing atmosphere comprising between about 0% $O_2$ to about 100% $O_2$ in $N_2$ and advantageously between about 0% $O_2$ to about 20% $O_2$, the concentration of oxygen vacancies ($V_{ox}$) may be reduced. By limiting the time of the MA process to times below one second, oxidation of the underlying $MoO_2$ electrode can be minimized.

In the next step, the second electrode layer, 306, is formed on dielectric layer, 304. The second electrode layer may be a conductive binary metal compound material as described above, a metal, or a combination thereof. Optionally, the DRAM capacitor stack may undergo a PMA treatment. The remaining full DRAM device (not shown) would then be manufactured using well known techniques.

Figure 4:
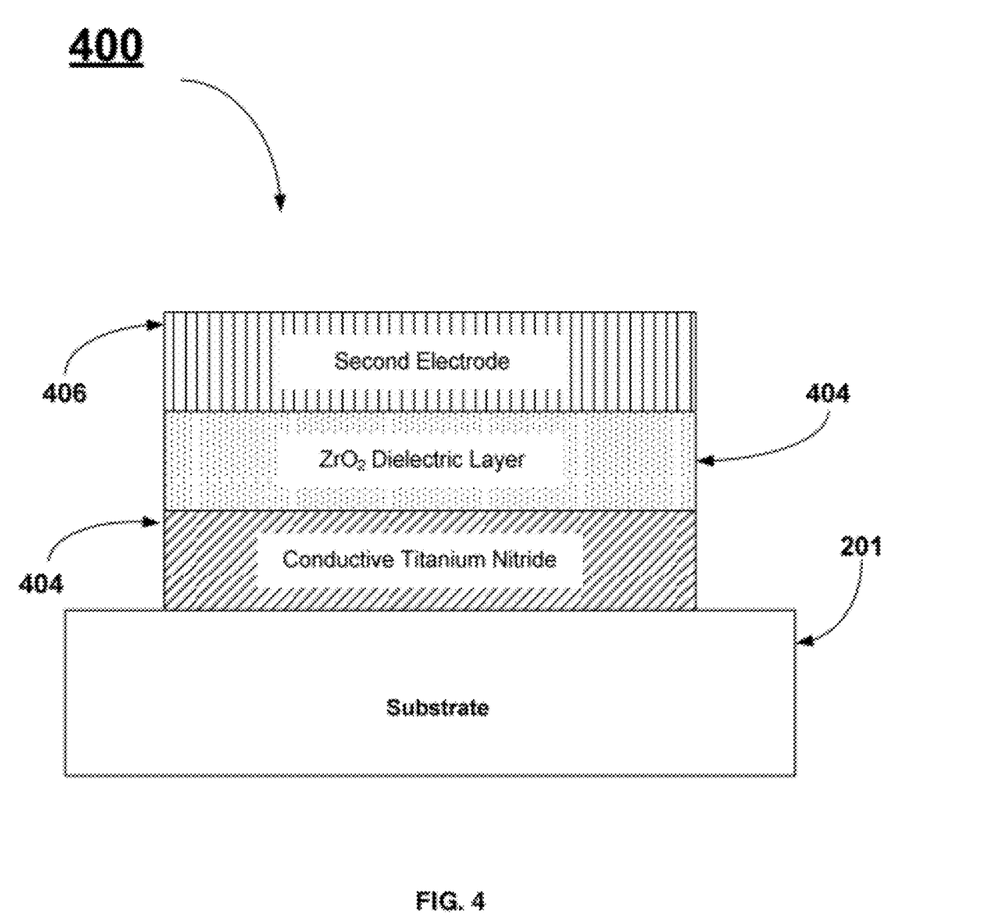
FIG. 4 illustrates a simplified cross-sectional view of a DRAM capacitor stack fabricated in accordance with some embodiments of the present invention.

FIG. 4 illustrates a specific example of a simple capacitor stack, 400, consistent with some embodiments of the present invention. Using the method as outlined in FIG. 1 and described above, first electrode layer, 402, is formed on substrate, 201. Generally, the substrate has already received several processing steps in the manufacture of a full DRAM device. First electrode layer, 402, comprises a TiN material. It would serve as a good template to promote the growth of the tetragonal or cubic phases of a $ZrO_2$ dielectric material in a later deposition step. Alternatively, a work function of ≥4.8 eV would be required if the dielectric layer is $ZrO_2$, and could be obtained with materials such as Ni, NiO, TiN, TiAlN or others.

Optionally, the first electrode layer may be annealed using an RTA technique wherein the temperature is quickly raised in the presence of a nitrogen containing gas such as $N_2$, forming gas, $NH_3$, etc or the electrode may be protected with a thin "flash" layer of a dielectric material.

Dielectric layer, 404, would then be formed on the first electrode layer, 402. In this example, a layer of $ZrO_2$ is formed as the dielectric layer, 404. The tetragonal and cubic phases of ZrO2 grow due to the crystal structure of the underlying TiN electrode material. The $ZrO_2$ layer generally has a physical layer thickness between 5 nm and 20 nm and exhibits a k value of >45.

The dielectric layer, 404, is then subjected to an MA process. In this process, the temperature of the surface substrate is raised from about room temperature to a process temperature between about 600 C and about 1200 C and advantageously to a temperature between about 600 C and about 900 C in less than one second and advantageously in less than about 10 milliseconds. The MA process may act to crystallize or further crystallize the dielectric layer. Additionally, if the MA process is performed in an oxidizing atmosphere comprising between about 0% $O_2$ to about 100% $O_2$ in $N_2$ and advantageously between about 0% $O_2$ to about 20% $O_2$, the concentration of oxygen vacancies ($V_{ox}$) may be reduced. By limiting the time of the MA process to times below one second, oxidation of the underlying TiN electrode can be minimized.

In the next step, the second electrode layer, 406, is formed on dielectric layer, 404. The second electrode layer may be a conductive binary metal compound material as described above, a metal, or a combination thereof. Optionally, the DRAM capacitor stack may undergo a PMA treatment. The remaining full DRAM device (not shown) would then be manufactured using well known techniques.

Figure 5:
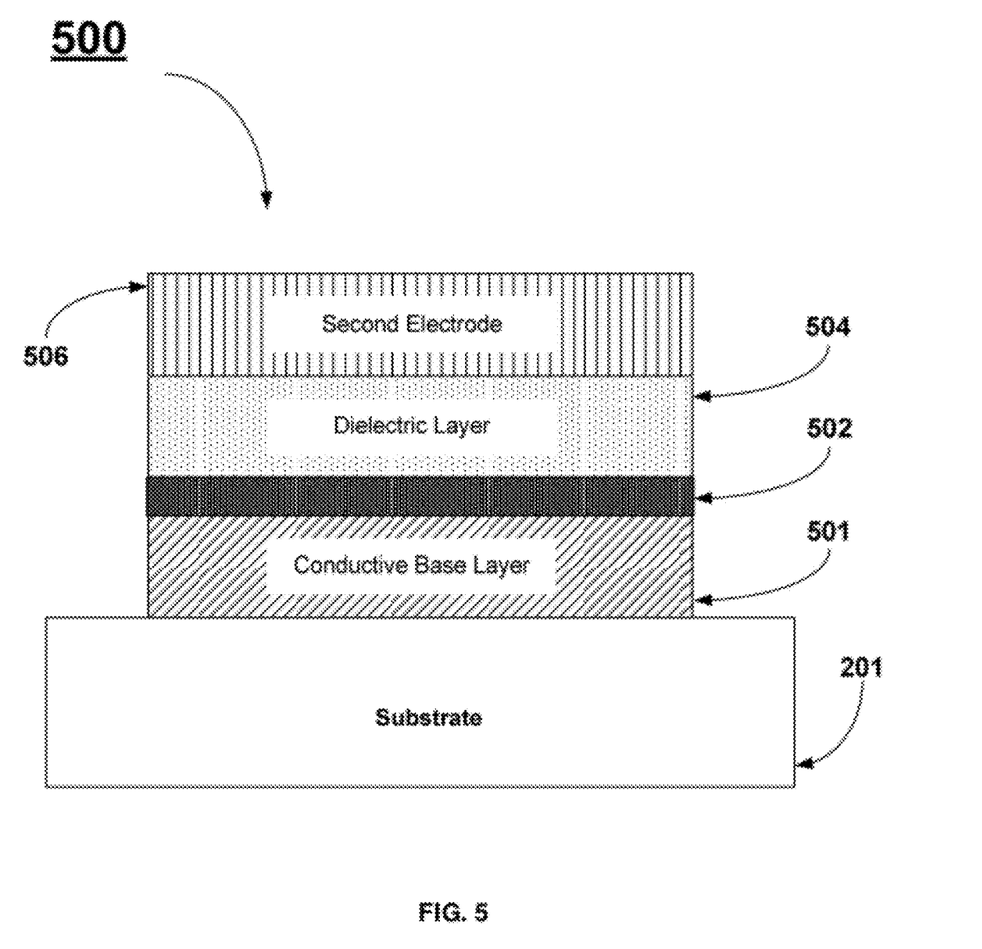
FIG. 5 illustrates a simplified cross-sectional view of a DRAM capacitor stack fabricated in accordance with some embodiments of the present invention.

FIG. 5 illustrates a simple capacitor stack, 500, consistent with some embodiments of the present invention. In this illustration, only a thin layer of the conductive binary metal compound is formed on top of a previously deposited conductive base layer, 501, to form the first electrode. The base layer may be a metal or highly conductive material such as TiN, TaN, TiAlN, Al, Cu, W, WN or the like. Using the method as outlined in FIG. 1 and described above, thin first electrode layer, 502, is deposited on base layer, 501. Generally, the substrate has already received several processing steps in the manufacture of a full DRAM device. In one example, thin first electrode layer, 502, comprises a conductive metal oxide material. Examples of the conductive metal oxides include molybdenum oxide, tungsten oxide, ruthenium oxide, rhenium oxide, chromium oxide, rhodium oxide, iridium oxide, manganese oxide, tin oxide, cobalt oxide, or nickel oxide. In a second example, thin first electrode, 502, comprises a conductive metal nitride. Examples of the conductive metal nitrides include the conductive compounds of titanium nitride, tantalum nitride, tungsten nitride, nickel nitride, or others. The choice of electrode material will depend on the choice of the dielectric layer to be formed in subsequent steps.

Optionally, the substrate with first electrode layer, 501/502, would be annealed in an inert atmosphere. The annealing process crystallizes the electrode layer. Optionally, the first electrode may be annealed in a reducing atmosphere. This is especially advantageous if the first electrode is a conductive metal oxide as discussed previously. Alternatively, the first electrode layer may be annealed using an RTA technique wherein the temperature is quickly raised in the presence of a nitrogen containing gas such as $N_2$, forming gas, $NH_3$, etc or the electrode may be protected with a thin "flash" layer of a dielectric material as discussed previously.

In the next step, dielectric layer, 504, would then be formed on the annealed base layer, 501, and thin first electrode layer, 502. A wide variety of dielectric materials have been targeted for use in DRAM capacitors. Examples of suitable dielectric materials comprise $SiO_2$, bilayer of $SiO_2$ and $Si_xN_y$, SiON, $HfO_2$, $ZrO_2$, $Ta_2O_5$, $TiO_2$, $SrTiO_3$ (STO), $SrBaTiO_x$ (SBT), $PbZrTiO_x$ (PZT) or doped versions of the same such as $Al:TiO_2$. These dielectric materials may be formed as a single layer or may be formed as a hybrid or nanolaminate structure.

The dielectric layer, 504, is then subjected to a MA process. In this process, the temperature of the surface substrate is raised from about room temperature to a process temperature between about 600 C and about 1200 C and advantageously to a temperature between about 600 C and about 900 C in less than 10 milliseconds. The MA process may act to crystallize or further crystallize the dielectric layer. Additionally, if the MA process is performed in an oxidizing atmosphere comprising between about 0% $O_2$ to about 100% $O_2$ in $N_2$ and advantageously between about 0% $O_2$ to about 20% $O_2$, the concentration of oxygen vacancies ($V_{ox}$) may be reduced. By limiting the time of the MA process to times below one second, oxidation of the underlying electrode can be minimized.

In the next step, the second electrode layer, 506, is formed on dielectric layer, 504. The second electrode layer may be a binary metal compound material as described above, a metal, or a combination thereof. The remaining full DRAM device (not shown) would then be manufactured using well known techniques.

Figure 6:
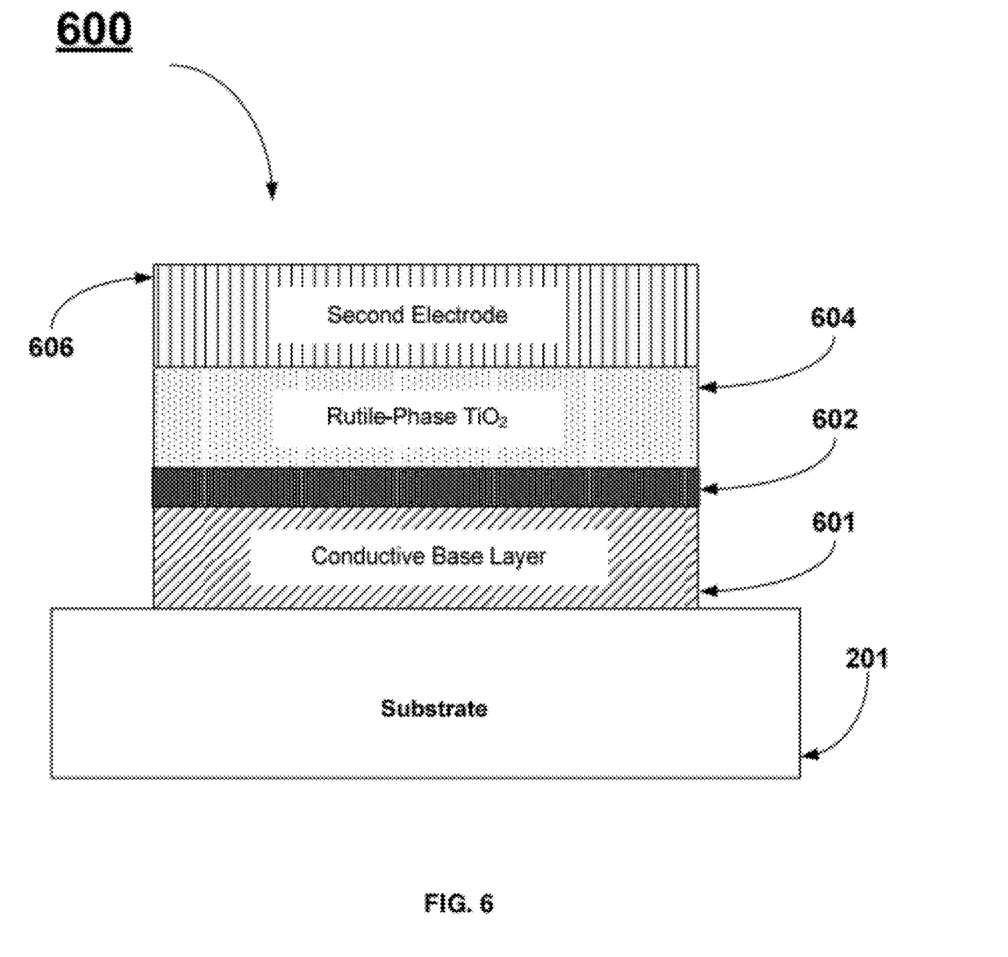
FIG. 6 illustrates a simplified cross-sectional view of a DRAM capacitor stack fabricated in accordance with some embodiments of the present invention.

FIG. 6 illustrates a specific example of a simple capacitor stack, 600, consistent with some embodiments of the present invention. In this illustration, only a thin layer of the conductive binary metal compound is formed on top of a previously deposited conductive base layer, 601, to form the first electrode. The base layer may be a metal or highly conductive material such as TiN, TaN, TiAlN, Al, Cu, W, WN or the like. Using the method as outlined in FIG. 1 and described above, thin first electrode layer, 602, is formed on base layer, 601. Generally, the substrate has already received several processing steps in the manufacture of a full DRAM device. In this example, thin first electrode layer, 602, comprises a $MoO_2$ material that also contains oxygen-rich components (Mo $O_{2+x}$). The thin first electrode layer, 602, may have a thickness between about 0.5 nm and 10 nm. The goal is to maximize the amount of crystalline $MoO_2$ present in thin first electrode layer, 602, because it has a distorted rutile crystal structure and would serve as a good template to promote the growth of rutile-phase $TiO_2$ dielectrics in a later deposition step. The presence of oxygen-rich materials ($MoO_{2+x}$) is to be minimized because they generally do not promote the growth of the rutile-phase crystal structure of the $TiO_2$ dielectric material. It is desirable that the crystalline $MoO_2$ phase account for ≥40% of the thin first electrode layer.

Optionally, the substrate with base layer, 601, and thin first electrode layer, 602, comprising $MoO_2$ mixed with $MoO_{2+x}$ would then be annealed in a reducing atmosphere to reduce the concentration of the oxygen-rich components. Generally, the reducing atmosphere will comprise $H_2$, or $NH_3$ mixed with an inert gas. The annealing in the reducing atmosphere may utilize either thermal energy, plasma energy, or RTA to activate the reducing atmosphere. The reducing atmosphere will crystallize the thin first electrode layer if there is an amorphous component and reduce the $MoO_{2+x}$ species to $MoO_2$.

In the next step, dielectric layer, 604, would then be formed on the annealed base layer, 601, and thin first electrode layer, 602. In this example, a layer of $TiO_2$ that exists predominantly (>30%) in the rutile-phase is deposited as the dielectric layer, 604. The rutile-phase of $TiO_2$ grows preferentially over the anatase-phase due to the distorted rutile-phase crystal structure of the underlying predominantly $MoO_2$ electrode material. The $TiO_2$ layer generally has a thickness between 5 nm and 20 nm and exhibits a k value of >40.

The dielectric layer, 604, is subjected to an MA process. In this process, the temperature of the surface substrate is raised from about room temperature to a process temperature between about 600 C and about 1200 C and advantageously to a temperature between about 600 C and about 900 C in less than 10 milliseconds. The MA process may act to crystallize or further crystallize the dielectric layer. Additionally, if the MA process is performed in an oxidizing atmosphere comprising between about 0% $O_2$ to about 100% $O_2$ in $N_2$ and advantageously between about 0% $O_2$ to about 20% $O_2$, the concentration of oxygen vacancies ($V_{ox}$) may be reduced. By limiting the time of the MA process to times below one second, oxidation of the underlying $MoO_2$ electrode can be minimized.

In the next step, the second electrode layer, 606, is formed on dielectric layer, 604. The second electrode layer may be a binary metal compound material as described above, a metal, or a combination thereof. Optionally, the DRAM capacitor stack may now receive a PMA treatment. The remaining full DRAM device (not shown) would then be manufactured using well known techniques.

Figure 7:
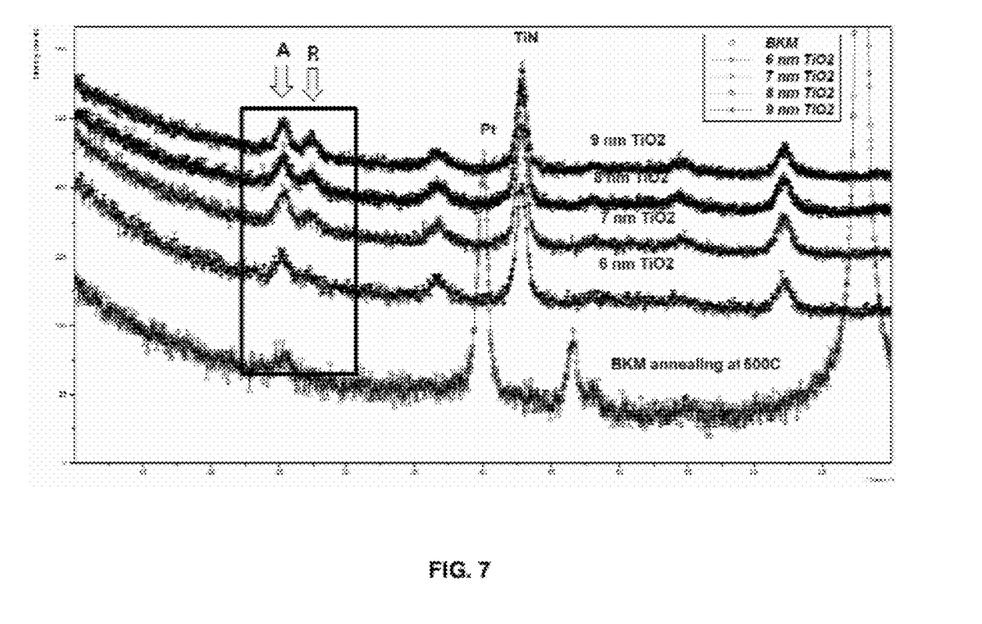
FIG. 7 presents x-ray diffraction data for various annealing treatments for a $TiO_2$ based capacitor stack in accordance with some embodiments of the present invention.

FIG. 7 present x-ray diffraction (XRD) data that illustrate the benefits of the MA process. The Best Known Method (BKM) process was a layer of $TiO_2$ dielectric of 9 nm formed on a Pt first electrode. The BKM process involved a rapid thermal oxidation (RTO) at 600 C for 5 minutes. The data for the BKM process indicates that most of the $TiO_2$ dielectric is present in the anatase crystalline phase as indicated by the peak highlighted by the arrow and the "A" designation. In these tests, various thicknesses of a $TiO_2$ dielectric layer were formed on a TiN first electrode. The $TiO_2$ dielectric layer was then subjected to an MA process. The data for the $TiN/TiO_2$ samples indicate that after the anneal, the rutile phase of $TiO_2$ is present as indicated by the peak highlighted by the arrow and the "R" designation. The rutile to anatase ratio (i.e. size of the "R" peak versus "A" peak) increases with $TiO_2$ layer thickness and is clearly present at the target thickness of 8 nm.

Figure 8:
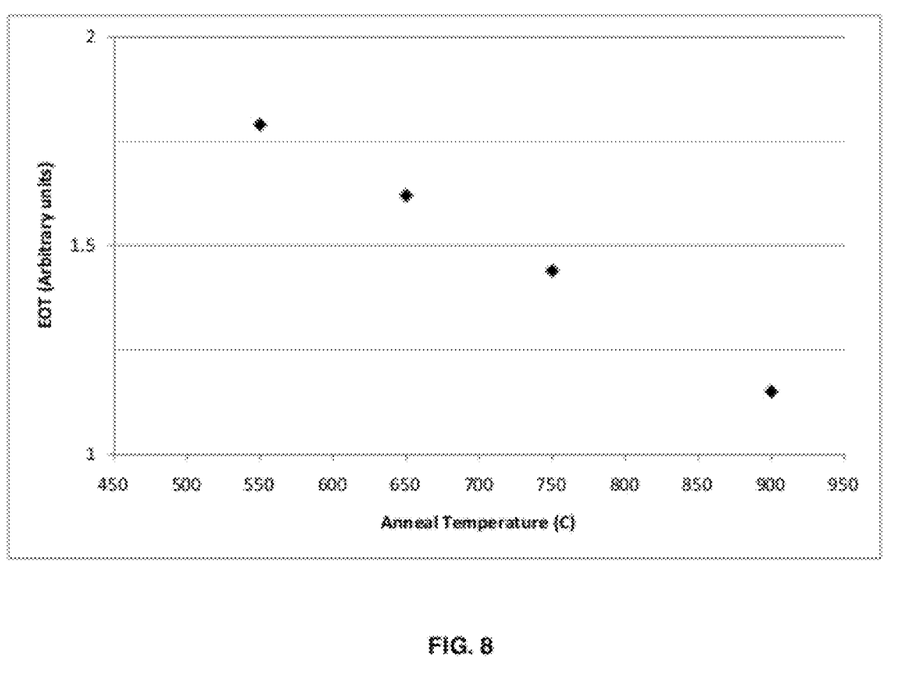
FIG. 8 presents a graph of normalized EOT versus temperature for a $ZrO_2$ based capacitor stack in accordance with some embodiments of the present invention.

FIG. 8 presents data that illustrates the relationship between the EOT and the temperature of the MA process on a $ZrO_2$ dielectric layer that has been formed on a TiN first electrode. The data has been normalized to protect the intellectual property of the device manufacturer. The EOT decreases with increasing MA process temperature. This effect is likely due to a higher fraction of the $ZrO_2$ adopting the desirable tetragonal crystal structure. The decrease in the EOT also indicates that the oxidation of the underlying TiN electrode material is minimal. The formation of an intermediate TiON layer would negatively impact the EOT of the capacitor stack.

Although various embodiments that incorporate the teachings of the present invention have been shown and described in detail herein, those skilled in the art can readily devise many other varied embodiments that still incorporate these teachings.

What is claimed:

1. A method for fabricating a capacitor stack, the method comprising:
    forming a first electrode layer on a substrate,
        wherein the first electrode layer comprises molybdenum oxide wherein the first electrode layer further comprises oxygen-rich molybdenum oxide ($MoO_{2+x}$);
    forming a dielectric layer on the first electrode layer,
        wherein the dielectric layer comprises titanium oxide having at least a partially rutile crystal structure, and
        wherein molybdenum oxide of the first electrode layer promotes growth of the rutile crystal structure of titanium oxide of the dielectric layer when the dielectric layer is formed;
    annealing the dielectric layer using a millisecond anneal process,
        wherein the millisecond anneal process comprises raising the temperature of the substrate from an initial temperature to an annealing temperature in less than one second,
        wherein the annealing utilizes one or more flash lamps,
        wherein the annealing converts titanium oxide of the dielectric layer into the rutile crystal structure; and
    forming a second electrode layer on the dielectric layer,
        wherein the dielectric layer is annealed prior to forming the second electrode layer.

2. The method of claim 1, wherein the milliseconds anneal process is performed in a temperature range between about 600 C and about 900 C.

3. The method of claim 1 wherein the milliseconds anneal process is performed in an atmosphere comprising from between about 0% $O_2$ in $N_2$ to about 20% $O_2$ in $N_2$.

4. The method of claim 1, wherein the one or more flash lamps are xenon flash lamps.

5. The method of claim 1, wherein the annealing converts titanium oxide into the rutile crystal structure without oxidizing molybdenum oxide of the first electrode layer.

6. The method of claim 1, further comprising annealing the first electrode layer in a reducing atmosphere to reduce a concentration of the oxygen-rich molybdenum oxide ($MoO_{2+x}$) in the first electrode layer and to increase a concentration of crystalline molybdenum oxide, wherein annealing the first electrode layer is performed prior to forming the dielectric layer.

7. The method of claim 1, wherein molybdenum oxide of the first electrode layer is at least about 40% in a crystalline phase.

8. The method of claim 1, further comprising annealing the capacitor stack after forming the second electrode.

* * * * *